US012328981B2

(12) United States Patent
Chan et al.

(10) Patent No.: US 12,328,981 B2
(45) Date of Patent: Jun. 10, 2025

(54) ELECTROLUMINESCENT DEVICE AND DISPLAY APPARATUS APPLYING THE SAME

(71) Applicant: AUO Corporation, Hsinchu (TW)

(72) Inventors: Chun-Hsiang Chan, Hsinchu (TW); To-Cheng Fan, Hsinchu (TW); Ting-Wei Tsai, Hsinchu (TW)

(73) Assignee: AUO CORPORATION, Hsinchu (TW)

( * ) Notice: Subject to any disclaimer, the term of this patent is extended or adjusted under 35 U.S.C. 154(b) by 574 days.

(21) Appl. No.: 17/868,829

(22) Filed: Jul. 20, 2022

(65) Prior Publication Data

US 2023/0056179 A1 Feb. 23, 2023

(30) Foreign Application Priority Data

Aug. 17, 2021 (TW) .................................. 110130275

(51) Int. Cl.
*H10H 20/851* (2025.01)
*H01L 25/075* (2006.01)
(Continued)

(52) U.S. Cl.
CPC ..... *H10H 20/8514* (2025.01); *H01L 25/0753* (2013.01); *H10H 20/812* (2025.01);
(Continued)

(58) Field of Classification Search
CPC ............. H10H 20/8514; H10H 20/812; H10H 20/819; H10H 20/825; H10H 20/856;
(Continued)

(56) References Cited

U.S. PATENT DOCUMENTS

2013/0285011 A1* 10/2013 Kojima ................ H10H 20/825
438/46
2015/0280066 A1* 10/2015 Fujimura ............. H10H 20/835
257/98
(Continued)

FOREIGN PATENT DOCUMENTS

CN 109920813 A 6/2019
CN 110992841 A 4/2020
(Continued)

OTHER PUBLICATIONS

Office Action issued by State Intellectual Property Office of the People's Republic of China on Aug. 27, 2024.
Office Action issued by State Intellectual Property Office of the People's Republic of China on Dec. 11, 2024.

*Primary Examiner* — Mark W Tornow
(74) *Attorney, Agent, or Firm* — WPAT, PC (57) ABSTRACT

An electroluminescent device, wherein the electroluminescent device includes a first-conductivity-type semiconductor layer, a second-conductivity-type semiconductor layer, an active layer, a first electrode, a second electrode, and an optical conversion material. The active layer is disposed between the first-conductivity-type semiconductor layer and the second-conductivity-type semiconductor layer and electrically connected with these two. The first-conductivity-type semiconductor layer has a light-emitting surface disposed on a side opposite to the active layer, and includes a plurality of 3D structures arranged regularly, extending from the light-emitting surface towards the active layer to jointly define at least one cavity having a depth greater than 70% a thickness of the first-conductivity-type semiconductor layer. The optical conversion material is filled in the cavity.

15 Claims, 10 Drawing Sheets

(51) Int. Cl.
*H10H 20/812* (2025.01)
*H10H 20/819* (2025.01)
*H10H 20/825* (2025.01)
*H10H 20/856* (2025.01)

(52) U.S. Cl.
CPC ........ *H10H 20/819* (2025.01); *H10H 20/825* (2025.01); *H10H 20/856* (2025.01)

(58) Field of Classification Search
CPC .... H10H 20/82; H10H 20/814; H10H 29/142; H01L 25/0753; Y02B 20/30
See application file for complete search history.

(56) References Cited

U.S. PATENT DOCUMENTS

| | | | | |
|---|---|---|---|---|
| 2015/0349201 | A1* | 12/2015 | Lee | H10H 20/018 438/22 |
| 2018/0175261 | A1* | 6/2018 | Yoo | H10H 20/018 |
| 2020/0152841 | A1* | 5/2020 | Han | H01L 25/0753 |
| 2022/0209077 | A1* | 6/2022 | Hyun | H10H 20/82 |

FOREIGN PATENT DOCUMENTS

| | | | |
|---|---|---|---|
| CN | 111052418 | A | 4/2020 |
| CN | 112234070 | A | 1/2021 |
| KR | 20080070414 | A | 7/2008 |

* cited by examiner

ELECTROLUMINESCENT DEVICE AND DISPLAY APPARATUS APPLYING THE SAME

This application claims the benefit of Taiwan application Serial No. 110130275, filed Aug. 17, 2021, the subject matter of which is incorporated herein by references.

BACKGROUND OF THE DISCLOSURE

Field of the Disclosure

The disclosure relates in general to a light-emitting device and a display apparatus using the same, and more particularly to an electroluminescent device and a display apparatus using the same.

Description of the Related Art

An electroluminescent device, such as a light-emitting diode (LED), is a kind of semiconductor device that can emit light. Due to its advantages such as short response time, low heat generation, vibration resistance, low power consumption, low power consumption, small thermal radiation, and long service life, it has been widely used in various consumer electronic products.

A micro light-emitting diode (μLED) display is composed of multiple discrete packaged miniaturized LEDs (dies) combined with thin film transistor circuit through flip-chip packaging technology to form an active driving structure with single-point addressing type electrical connection, so that the μLED display has the characteristics of self-luminescence. Compared with organic light-emitting diode (OLED) displays, it has advantages of higher material stability, longer service life, higher brightness, high-speed response at the nanosecond level, higher modulation speed and higher signal transmission, and has gradually become the mainstream of the new generation monitor.

In order to achieve a full-color μLED display, a color conversion technology is adopted to provide self-luminous display sub-pixels with different light colors, in which the monochromatic light emitted from the μLED dies passes through optical conversion materials, such as photoluminescence fluorescent materials (e.g., photoluminescence phosphor), Quantum Dots (QD) materials, luminescent dyes, or a combination thereof, for generating lights with three primary colors. Currently, the mainstream method for forming the sub-pixels in the market is to encapsulate blue μLED dies with various quantum dot materials, so that the blue light emitted by the blue μLED die of each sub-pixel can converted into light with the desired color.

However, the light conversion efficiency of the optical conversion materials has its limit. In order to improve the absorption/conversion efficiency of the blue light, it is necessary to increase the concentration of quantum dots in the optical conversion materials or increase the encapsulating thickness of the optical conversion materials. This not only increases the manufacturing cost, but also is not conducive to the miniaturization of the μLED dies, and also limits the thinning of the μLED display.

Therefore, there is a need to provide an advanced electroluminescent device and a display apparatus using the same to overcome the drawbacks of the prior art.

SUMMARY OF THE DISCLOSURE

One embodiment of the present disclosure is to provide an electroluminescent device, wherein the electroluminescent device includes a first-conductivity-type semiconductor layer, a second-conductivity-type semiconductor layer, an active layer, a first electrode, a second electrode, and an optical conversion material. The active layer is disposed between the first-conductivity-type semiconductor layer and the second-conductivity-type semiconductor layer and electrically connected with these two. The first-conductivity-type semiconductor layer has a light-emitting surface disposed on a side opposite to the active layer, and includes a plurality of three-dimensional (3D) structures arranged regularly; wherein the plurality of 3D structures extend from the light-emitting surface towards the active layer to jointly define at least one cavity. The first electrode electrically contacts to the first-conductivity-type semiconductor layer. The second electrode electrically contacts to the second-conductivity-type semiconductor layer. The cavity has a depth greater than 70% the thickness of the first-conductivity-type semiconductor layer. The optical conversion material is filled in the cavity.

Another embodiment of the present disclosure is to provide a display apparatus, wherein the display apparatus includes a circuit substrate, at least one reflection bank, a first light-emitting unit, a second light-emitting unit, and a third light-emitting unit. The reflective bank is disposed on the circuit substrate, and defines a plurality of accommodating spaces together with the circuit substrate. The first light-emitting unit and the second light-emitting unit have the same structure as the electroluminescent device as described above, the first light-emitting unit is disposed in a first accommodating space of the plurality of accommodating spaces, and emits a red light; the second light-emitting unit is disposed in a second accommodating space of the plurality of accommodating spaces, and emits green light; the third light-emitting unit is disposed in a third accommodating space of the plurality of accommodating spaces, and emits blue light.

According to the above embodiments, the present disclosure provides an electroluminescent device and a display apparatus applying the same. A plurality of regularly arranged 3D structures are formed on a light-emitting surface of a semiconductor layer, extending from the light-emitting surface towards the active layer to jointly define at least one cavity, so that the depth of the cavity cab be substantially greater than 70% the thickness of the semiconductor layer, and allowing an optical conversion material filled in the cavity.

By filling the optical conversion material in the cavity of the semiconductor layer, the reaction probability of the light emitted by the active layer of the electroluminescent device and the optical conversion material can be increased without increasing the overall thickness of the optical conversion material encapsulating the electroluminescent device or increasing the concentration of quantum dots contained in the optical conversion material. Thereby, the light absorption/conversion efficiency of the electroluminescent device can be improved; the manufacturing cost can be effectively reduced, and the miniaturization of the electroluminescent device and the thinning of the display apparatus applying the electroluminescent device can achieved at the same time.

BRIEF DESCRIPTION OF THE DRAWINGS

The above and other aspects of the disclosure will become better understood with regard to the following detailed description of the preferred but non-limiting embodiment(s). The following description is made with reference to the accompanying drawings.

DETAILED DESCRIPTION OF THE DISCLOSURE

The present disclosure provides an electroluminescent device and a display apparatus applying the same, which can improve the absorption/conversion efficiency of light passing through the optical conversion material, effectively reduce the manufacturing cost of the display apparatus, and achieve the miniaturization of the electroluminescent device and the thinning of the display apparatus. The above and other aspects of the disclosure will become better understood with regard to the following detailed description of the preferred but non-limiting embodiment(s). The following description is made with reference to the accompanying drawings:

Several embodiments of the present disclosure are disclosed below with reference to accompanying drawings. However, the structure and contents disclosed in the embodiments are for exemplary and explanatory purposes only, and the scope of protection of the present disclosure is not limited to the embodiments. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification.

Figure 1A:
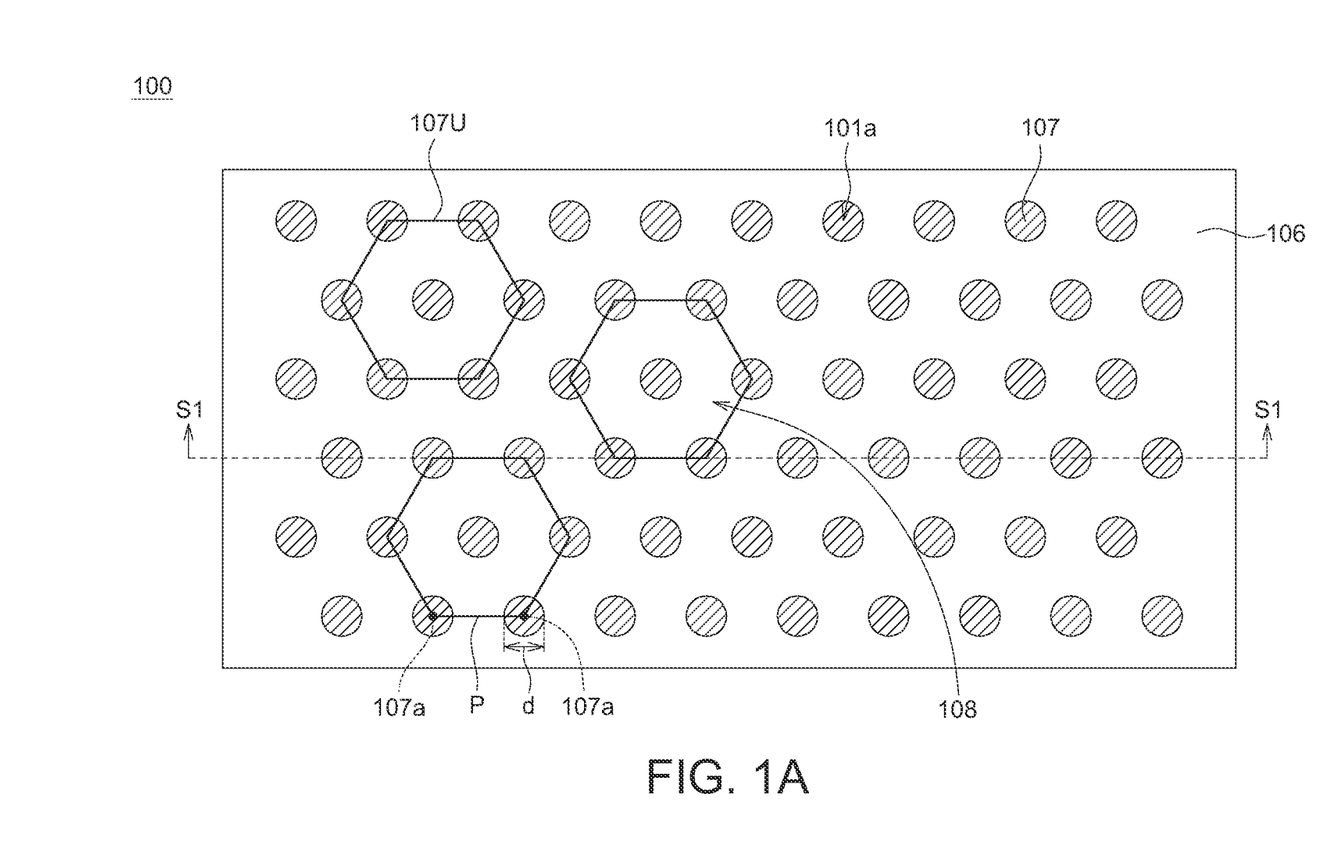
FIG. 1A is a top view illustrating the structure of an electroluminescent device according to one embodiment of the present disclosure.
Figure 1B:
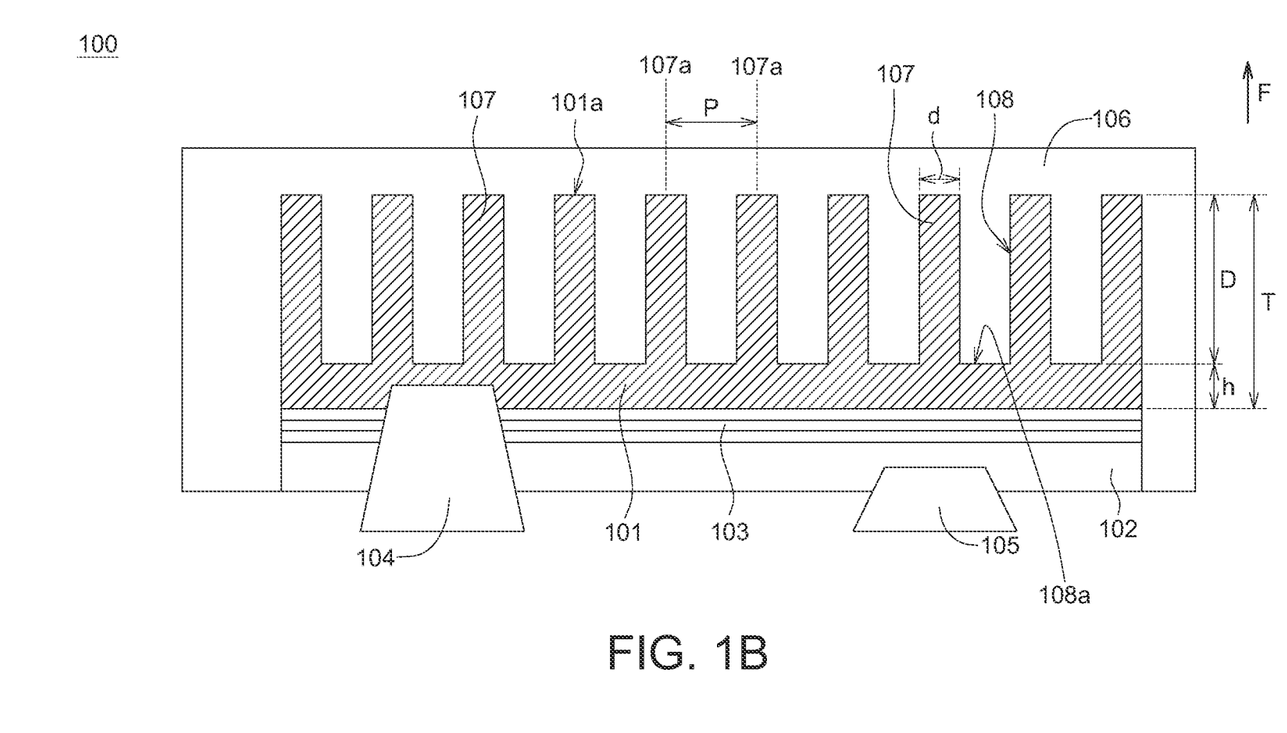
FIG. 1B is a cross-sectional view of the electroluminescent device taken along a cutting line S1 as depicted in FIG. 1A.

FIG. 1A is a top view illustrating the structure of an electroluminescent device 100 according to one embodiment of the present disclosure; and FIG. 1B is a cross-sectional view of the electroluminescent device 100 taken along a cutting line S1 as depicted in FIG. 1A. As shown in FIG. 1B, the electroluminescent device 100 includes a first-conductivity-type semiconductor layer 101, a second-conductivity-type semiconductor layer 102, an active layer 103, a first electrode 104, a second electrode 105, and an optical conversion material 106.

The active layer 103 is disposed between the first-conductivity-type semiconductor layer 101 and the second-conductivity-type semiconductor layer 102 and electrically contacts with the first-conductivity-type semiconductor layer 101 and the second-conductivity-type semiconductor layer 102. Wherein, the first-conductivity-type semiconductor layer 101, the second-conductivity-type semiconductor layer 102 and the active layer 103 may be an epitaxial stacked structure formed by a deposition technology, such as a metal-organic chemical vapor deposition (MOCVD).

For example, in some embodiments of this disclosure, the first-conductivity-type semiconductor layer 101 and the second-conductivity-type semiconductor layer 102 may be an n-type semiconductor layer and a p-type semiconductor layer, respectively; the active layer 103 may be a multiple quantum well (MQW) structure including a plurality of semiconductor nanostructures, such as semiconductor nanotubes, semiconductor nanotubes, nano-particles or the arbitrary combinations thereof.

The material constituting this MQW structure includes aluminum indium gallium nitride (AlGaInN) or gallium nitride (GaN). In the present embodiment, the first-conductivity-type semiconductor layer 101 may include an n-type GaN layer; the second-conductivity-type semiconductor layer 102 may include a p-type GaN layer; the active layer 103 is a MQW structure including GaN.

The first-conductivity-type semiconductor layer 101 has a light-emitting surface 101a, and includes a plurality of 3D structures arranged regularly; wherein the plurality of 3D structures extend from the light-emitting surface 101a towards the active layer 103 to jointly define at least one cavity (for example, a plurality of cavities 108); and each of the cavities 108 has a depth D greater than 70% the thickness T of the first-conductivity-type semiconductor layer 101.

In the present disclosure, the plurality of 3D structures include a plurality of protruding pillars 107 with substantially the same size and shape and are regularly arranged; there is a pitch P between two adjacent protruding pillars 107; and the pitch P is substantially 1.5 to 5 times of the diameter d of the protruding pillars 107.

For example, in this embodiment, as shown in FIG. 1A, the plurality of protruding pillars 107 are arranged in a honeycomb pattern, and seven protruding pillars 107 are used to form an arrangement unit 107U in which the central axes of the seven protruding pillars 107 are respectively aligned to the center of a hexagonal pattern and its six vertices. A plurality of arrangement units 107U can be formed by the same way, and are arranged into a two-dimensional hexagonal close-packed (HCP) structure, so as to define a plurality of regularly arranged cavities 108 on the light-emitting surface 101a of the first-conductivity-type semiconductor layer 101. For example, each of the cavities 108 may be a space jointly defined (and jointly surrounded by) the protruding pillars 107 disposed on the six vertices and the center of each arrangement unit 107U.

The diameter d of the protruding pillars 107 is about 0.5 micrometers (μm) to 2 μm. The pitch P (the distance between two central axes 107a) of two adjacent protruding pillars 107 is about 2 to 3 times the diameter d of the protruding pillars 107. Each of the cavities 108 that is jointly defined by the plurality of 3D structures (i.e., the protruding pillars 107)

has a bottom surface 108a departed from the active layer 103 for a distance h substantially less than 1 μm, and has a depth D about 2 μm to 3 μm.

In addition, each of the protruding pillars 107 has a circular cross-section perpendicular to the stacking direction F of the active layer 103, the first-electricity-type semiconductor layer 101 and the second-electricity-type semiconductor layer 102 (as shown in FIG. 1A), and a rectangular (strip) longitudinal section parallel to the stacking direction F, so that each of the cavities 108 has a rectangular (strip) longitudinal section parallel to the stacking direction F (as shown in FIG. 1B).

However, it should be appreciated that the shape and arrangement of the 3D structures (i.e., the protruding pillars 107) are not limited to this regard. Any 3D structure that can define a plurality of cavities 108 regularly arranged on the light-emitting surface 101a of the first-electricity-type semiconductor layer 101 may not departing from the spirit and scope of the description. Several embodiments with other 3D structures will be disclosed below.

The first electrode 104 electrically contacts to the first-electricity-type semiconductor layer 101. The second electrode 105 electrically contacts to the second-electricity-type semiconductor layer 102. In some embodiments of this disclosure, one end of the first electrode 104 is disposed on the side of the second-electricity-type semiconductor layer 102 away from the active layer 103; the other end of the first electrode 104 passes through the second-electricity-type semiconductor layer 102 and the active layer 103 and electrically contacts to the first-electricity-type semiconductor layer 101, but is electrically isolated from the second-electricity-type semiconductor layer 102 and the active layer 103. The second electrode 105 is disposed on the side of the second-electricity-type semiconductor layer 102 away from the active layer 103, and is electrically contacts with the second-electricity-type semiconductor layer 102 directly.

Materials constituting the first electrode 104 and the second electrode 105 may be the same or different. In some embodiments of the present disclosure, the material constituting the first electrode 104 and the second electrode 105 may be selected from a group consisting of indium (In), aluminum (Al), titanium (Ti), gold (Au), tungsten (W), aluminum (Al), neodymium (Nd), palladium (Pd), platinum (pt), zirconium (Zr), nickel/silicon (Ni/Si), indium tin (InSn), titanium nitride (TiN), tungsten silicide (WSi), platinum Indium (PtIn$_2$), zirconium nitride (/ZrN) and the arbitrary combinations thereof.

The optical conversion material 106 is filled in each of the cavities 108. In some embodiments of the present specification, the optical conversion material 106 may be a photoluminescent fluorescent material, a quantum dot material, a luminescent dye, or an arbitrary combination thereof. For example, in one embodiment, the light emitted from the active layer 103 and passing through the optical conversion material 106, may be converted into red light R having a wavelength substantially ranging from 570 nanometers (nm) to 750 nm. In another embodiment, the light emitted from the active layer 103 and passing through the optical conversion material 106, may be converted into green light having a wavelength substantially ranging from 495 nm to 570 nm (not shown).

In the present embodiment, the optical conversion material 106 is filled in the cavities 108 (the spaces defined between the protruding pillars 107) defined by a plurality of 3D structures, and extends beyond the light-emitting surface 101a of the first-electricity-type semiconductor layer 101, so as to encapsulate the first-electricity-type semiconductor layer 101, the active layer 103 and the second-electricity-type semiconductor layer 102 as a whole.

By filling the optical conversion material 106 in the cavities 108, the reaction probability of the light emitted by the active layer 103 of the and the optical conversion material 106 can be increased without increasing the encapsulating thickness of the optical conversion material 106 or increasing the concentration of quantum dots contained in the optical conversion material 106. Thereby, the light absorption/conversion efficiency of the electroluminescent device 100 can be improved; the manufacturing cost can be effectively reduced, and the miniaturization and the thinning of the electroluminescent device 100 can achieved at the same time.

Figure 2A:
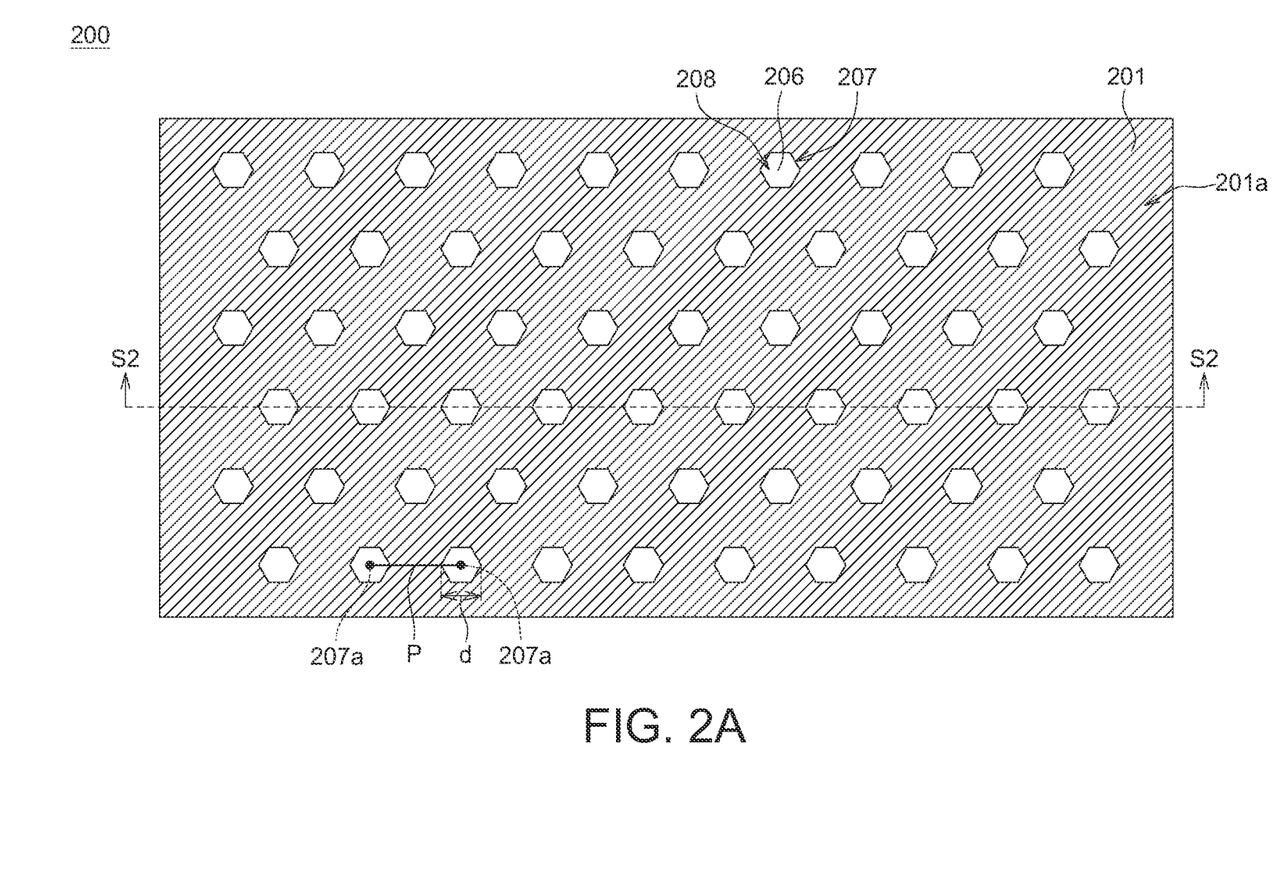
FIG. 2A is a top view illustrating the structure of an electroluminescent device according to another embodiment of the present disclosure.
Figure 2B:
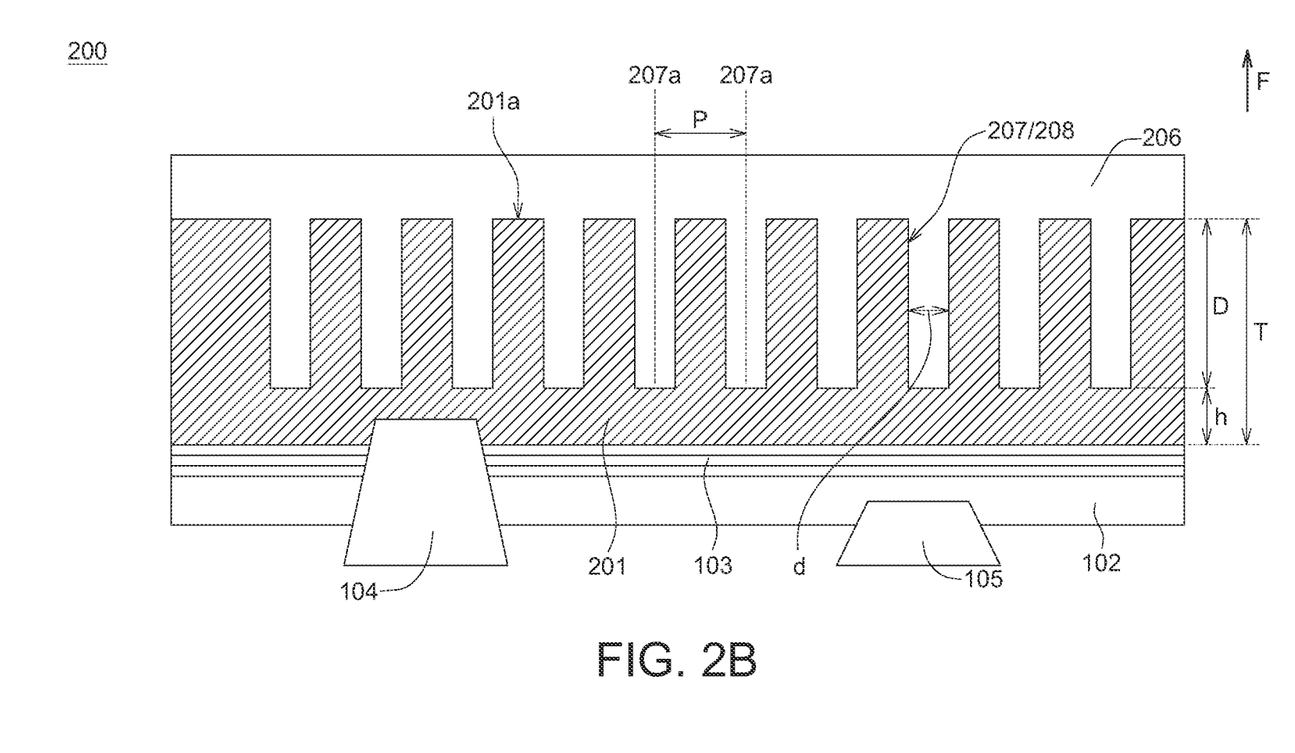
FIG. 2B is a cross-sectional view of the electroluminescent device taken along a cutting line S2 as depicted in FIG. 2A.

FIG. 2A is a top view illustrating the structure of an electroluminescent device 200 according to another embodiment of the present disclosure; and FIG. 2B is a cross-sectional view of the electroluminescent device 200 taken along a cutting line S2 as depicted in FIG. 2A. The structure of the electroluminescent device 200 is substantially similar to that of the electroluminescent device 100, and the main difference there between is the configuration of the 3D structure of the first-electricity-type semiconductor layer 201.

In some embodiments of the present disclosure, the 3D structure of the first-electricity-type semiconductor layer 201 includes a plurality of regularly arranged recesses 207 with substantially the same size and shape, and there is a pitch P between the central axes 207a of two adjacent recesses 207 substantially 1.5 to 5 times the diameter d of the recesses 207. In the present embodiment, the diameter d of the recesses 207 is about 0.5 μm to 2 μm. The pitch P between the central axes 207a of two adjacent recesses 207 is substantially 2 to 3 times the diameter d of the recesses 207.

As shown in FIG. 2A, each of the recesses 207 has a polygonal cross-section (for example, a hexagonal cross-section, but not limited this to) perpendicular to the stacking direction F of the active layer 103, the first-electricity-type semiconductor layer 201 and the second-electricity-type semiconductor layer 102, and a rectangular longitudinal cross-section (for example, an elongated longitudinal cross-section, but not limited this to) parallel to the stacking direction F, so that a plurality of cavities 208 each of which corresponds to one of the recesses 207 can be defined (as shown in FIG. 2B).

The optical conversion material 206 is not only filled in the recesses 207 (cavities 208), but also extends to cover the light-emitting surface 201a of the first-electricity-type semiconductor layer 201, but does not completely cover the first-electricity-type semiconductor layer 201, the active layer 103 and the second-electricity-type semiconductor layer 102. By filling the optical conversion material 206 in each of the cavities 208, the reaction probability of the light emitted by the active layer 103 of the and the optical conversion material 206 can be increased without increasing the encapsulating thickness of the optical conversion material 206 or increasing the concentration of quantum dots contained in the optical conversion material 206. Thereby, the light absorption/conversion efficiency of the electroluminescent device 200 can be improved; the manufacturing cost can be effectively reduced, and the miniaturization and the thinning of the electroluminescent device 200 can achieved at the same time.

Figure 3:
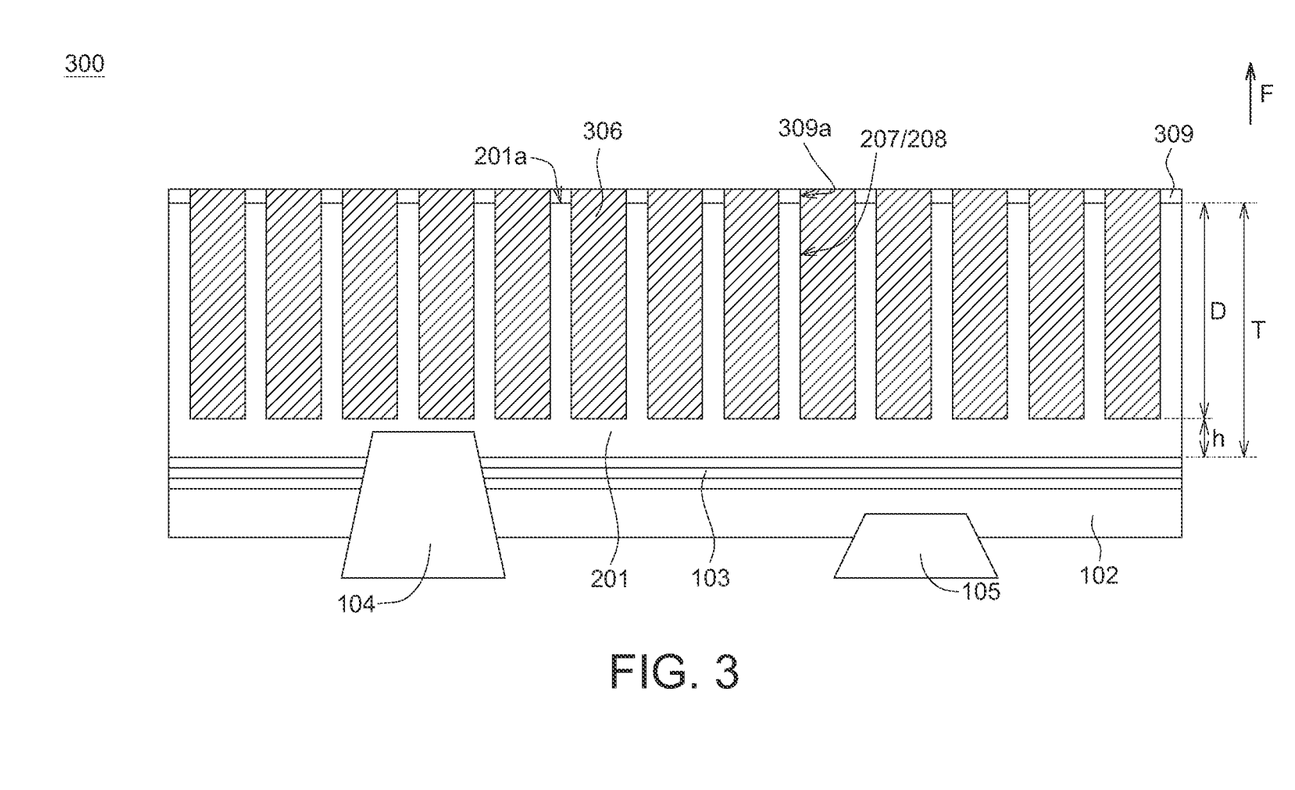
FIG. 3 is a cross-sectional view illustrating the structure of an electroluminescent device according to yet another embodiment of the present disclosure.

FIG. 3 is a cross-sectional view illustrating the structure of an electroluminescent device 300 according to yet another embodiment of the present disclosure. The structure of the electroluminescent device 300 is substantially similar to that of the electroluminescent device 200, and the main difference there between is that the electroluminescent device 300 (optionally) includes a metal reflecting layer 309.

In the present embodiment, the metal reflecting layer 309 is disposed outside the light-emitting surface 201*a* of the first-electricity-type semiconductor layer 201, and is used to reflect the external light that incidents from the environment outside of the light-emitting surface 201*a* to the inside of the first-electricity-type semiconductor layer 201, and to reflect a portion of the light emitted from the active layer 103. The metal reflecting layer 309 has at least one through hole (in the present embodiment, has a plurality of through holes 309*a*), and each of the through holes 309*a* is aligned with a corresponding cavity 208. The optical conversion material 306 is only filled in the recesses 207 (i.e., the cavities 208), and does not extend beyond the through holes 309*a* of the metal reflecting layer 309.

Most of the light (e.g., blue light) emitted from the active layer 103 and passing through the optical conversion material 306 can be converted into green light having a wavelength substantially ranging from 495 nm to 570 nm. A portion of the green light and a portion of the unconverted blue light may exit to the outside of the light-emitting surface 301*a* via the through hole 309*a* at a divergence angle of (for example, less than 5°); and the other portions of the unconverted blue light and the green light are reflected, by the metal reflecting layer 309, returning to the optical conversion material 306 and the first-electricity-type semiconductor layer 201. The returning lights can still exit to the outside of the light-emitting surface 301*a* via the through hole 309*a*, after multiple reflections. Through the reflection of the metal reflecting layer 309, the reaction probability between the light emitted from the active layer 103 and the optical conversion material 306 can be increased, and the conversion efficiency of green light can be improved.

Figure 4:
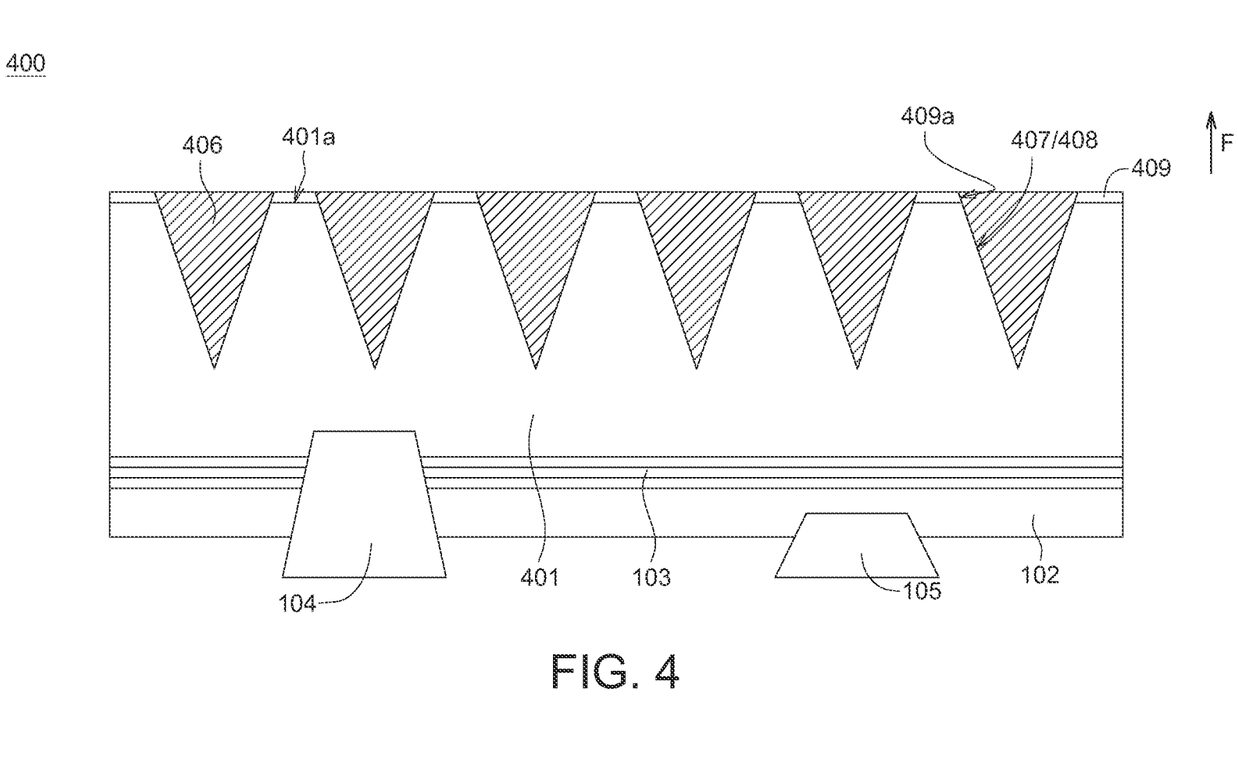
FIG. 4 is a cross-sectional view illustrating the structure of an electroluminescent device according to a fourth embodiment of the present disclosure.

FIG. 4 is a cross-sectional view illustrating the structure of an electroluminescent device 400 according to a fourth embodiment of the present disclosure. The structure of the electroluminescent device 400 is substantially similar to that of the electroluminescent device 300, and the main difference there between is the configuration of the 3D structure of the first-electricity-type semiconductor layer 401.

In the present embodiment, the 3D structure of the first-electricity-type semiconductor layer 401 includes a plurality of regularly arranged recesses 407 with substantially the same size and shape. Each of the recesses 407 has a wedge-shaped longitudinal section wide at the top and narrow at the bottom, perpendicular to the stacking direction F of the active layer 103, the first-electricity-type semiconductor layer 401 and the second-electricity-type semiconductor layer 402, so that a plurality of cavities 408 each of which corresponds to one of the recesses 407 can be defined. The optical conversion material 406 is only filled in the recesses 407 (i.e., the cavities 408), and does not extend beyond the through hole 409*a* of the metal light reflecting layer 409.

Figure 5:
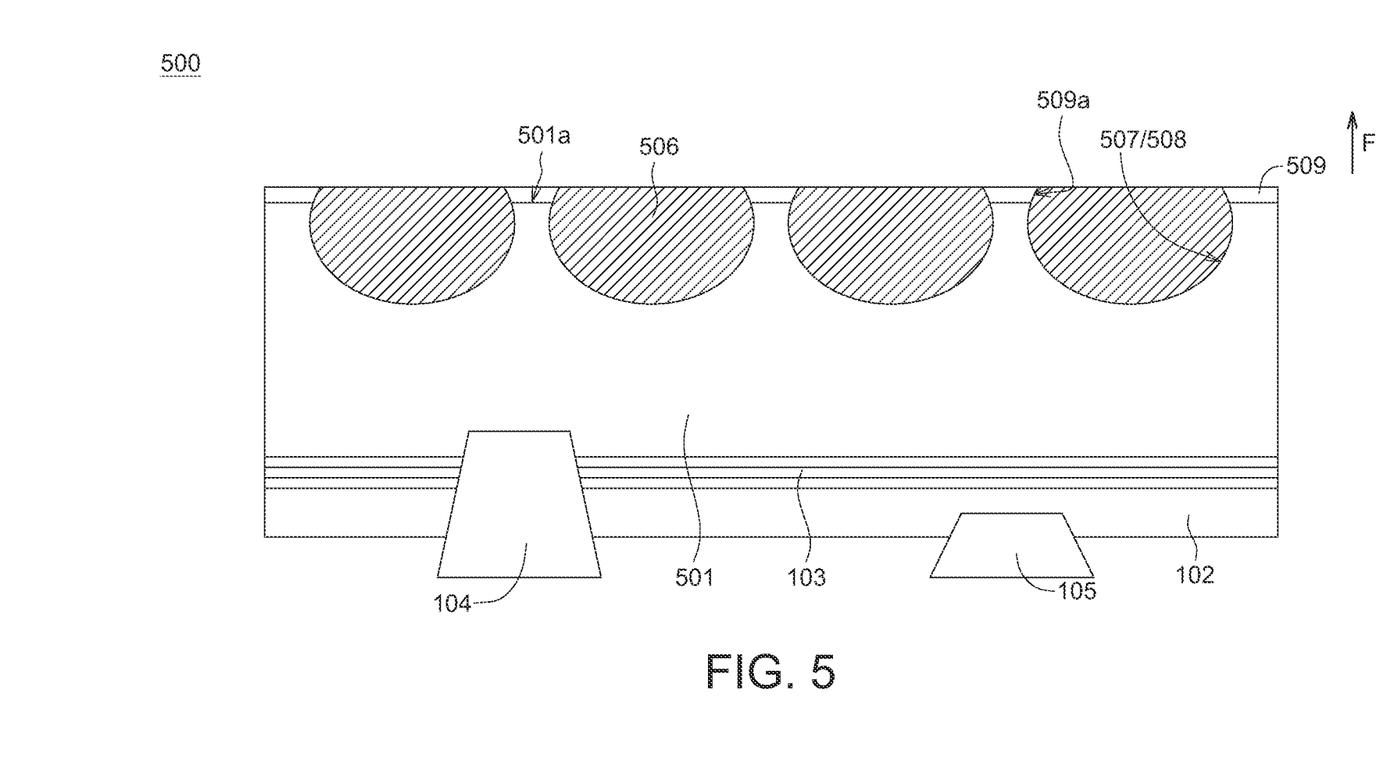
FIG. 5 is a cross-sectional view illustrating the structure of an electroluminescent device according to a fifth embodiment of the present disclosure.

FIG. 5 is a cross-sectional view illustrating the structure of an electroluminescent device 500 according to a fifth embodiment of the present disclosure. The structure of the electroluminescent device 500 is substantially similar to that of the electroluminescent device 300, and the main difference there between lines in the structural configuration of the 3D structure of the first-electricity-type semiconductor layer 501.

In the present embodiment, the 3D structure of the first-electricity-type semiconductor layer 501 includes a plurality of regularly arranged recesses 507 with substantially the same size and shape. Each of the recesses 507 has an arc-shaped longitudinal section, perpendicular to the stacking direction F of the active layer 103, the first-electricity-type semiconductor layer 501 and the second-electricity-type semiconductor layer 502, so that a plurality of cavities 508 each of which corresponds to one of the recesses 507 can be defined. The optical conversion material 506 is only filled in the recesses 507 (i.e., the cavities 508), and does not extend beyond the through hole 509*a* of the metal light reflecting layer 509.

Figure 6:
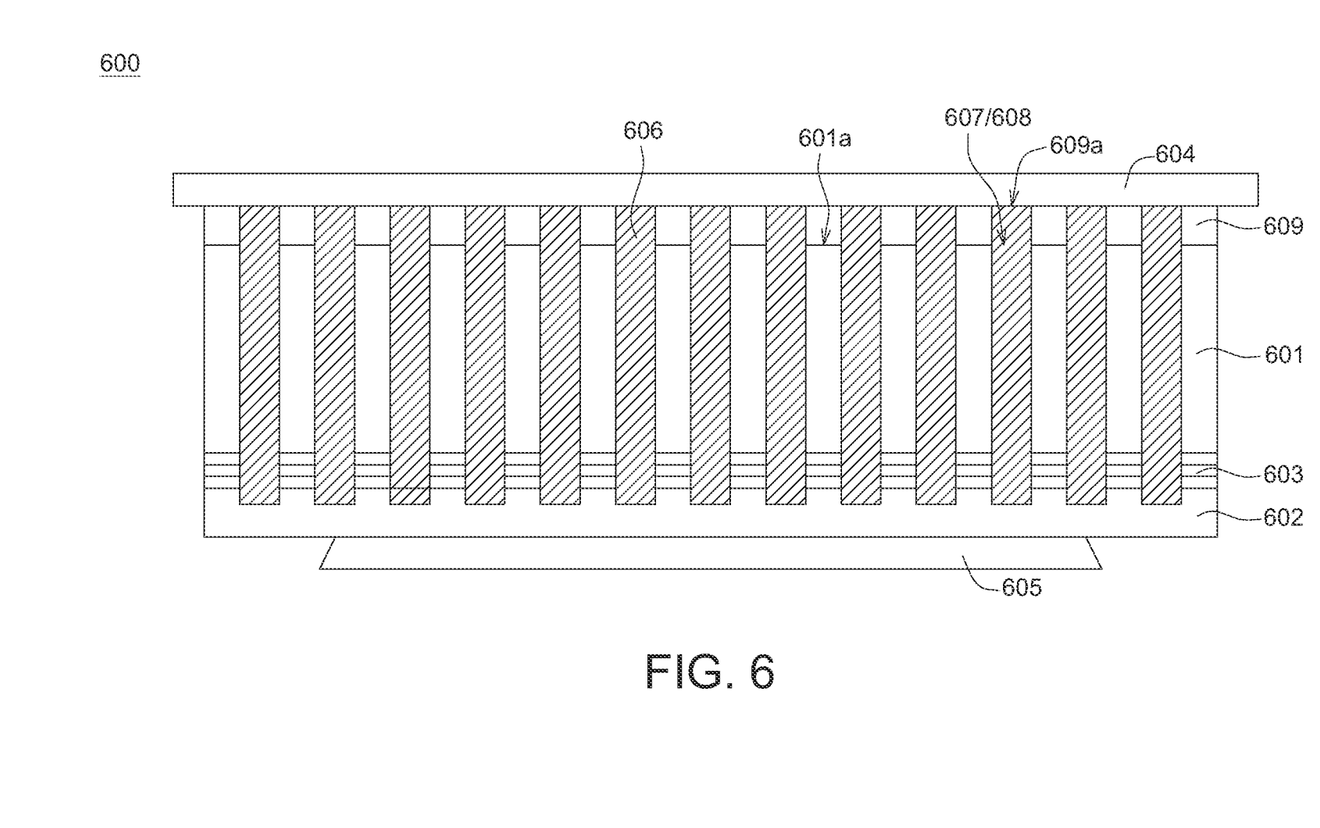
FIG. 6 is a cross-sectional view illustrating the structure of an electroluminescent device according to a sixth embodiment of the present disclosure.

FIG. 6 is a cross-sectional view illustrating the structure of an electroluminescent device 600 according to a sixth embodiment of the present disclosure. The structure of the electroluminescent device 600 is substantially similar to that of the electroluminescent device 200, and the main difference lies in the structural configuration of the cavities 608 for filling the optical conversion material 606, the active layer 603, the first electrode 604 and the second-electricity-type semiconductor layer 602.

In the present embodiment, the 3D structure of the first-electricity-type semiconductor layer 601 includes a plurality of regularly arranged recesses 607. Each of the recesses 607 extends down wards, from the light-emitting surface 601*a* of the first-electricity-type semiconductor layer 601, along a direction parallel to a stacking direction F of the active layer 603, the first-electricity-type semiconductor layer 601 and the second-electricity-type semiconductor layer 602; passes through the first-electricity-type semiconductor layer 601 and the active layer 603; and partially extends into (but not penetrating through) the second-electricity-type semiconductor layer 602, so that a plurality of cavities 608 each of which corresponds to one of the recesses 607 can be defined. The optical conversion material 606 is only filled in the recesses 607 (i.e., the cavities 608), and does not extend beyond the through hole 609*a* of the metal light reflecting layer 609.

The first electrode 604 is disposed on the side of the metal reflecting layer 609 away from the light-emitting surface 601*a* of the first-electricity-type semiconductor layer 601, and is electrically connected to the first-electricity-type semiconductor layer 601 via the metal reflecting layer 609. The second electrode 605 is disposed on the side of the second-electricity-type semiconductor layer 602 away from the active layer 603 and electrically contacts to the second-electricity-type semiconductor layer 602 directly. In the present embodiment, the first electrode 601 can be a transparent electrode layer containing indium tin oxide (ITO). The second electrode 605 can serve as a metal reflective layer.

Figure 7:
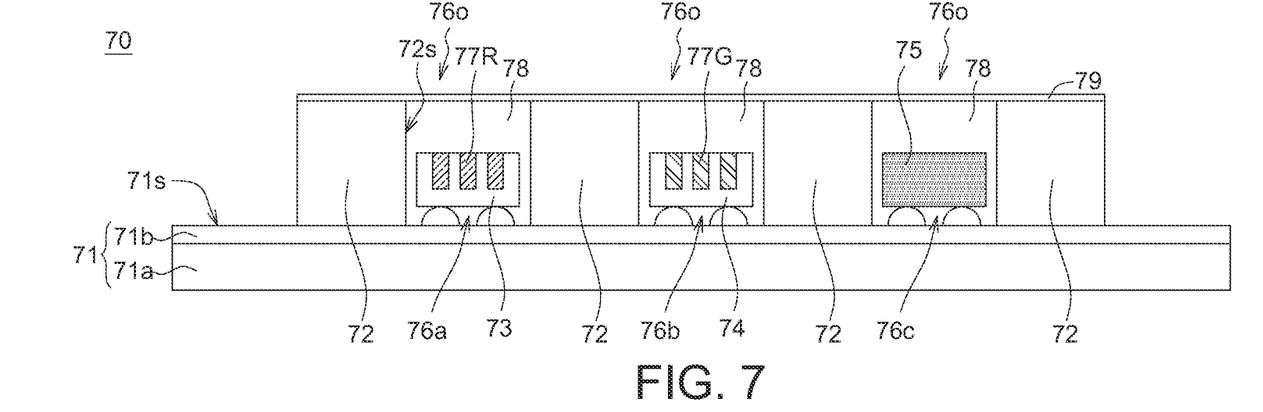
FIG. 7 is a cross-sectional view illustrating the structure of a display apparatus according to one embodiment of the present disclosure.

The electroluminescent device 100, 200, 300, 400, 500 or 600 as described above can be an LED device, and can be applied to form a display apparatus 70. FIG. 7 is a cross-sectional view illustrating the structure of a display apparatus 70 according to one embodiment of the present disclosure. In the present embodiment, the display apparatus 70 applies a plurality of light-emitting units (such as, the first light-emitting unit 73 and the second light-emitting unit 74) that have the same structure of the electroluminescent device 200 as described in FIGS. 2A and 2B.

The display apparatus 70 includes a circuit substrate 71, at least one reflection bank (such as, a plurality of reflection banks 72), a first light-emitting unit 73, a second light-emitting unit 74, and a third light-emitting unit 75. The circuit substrate 71 includes a base layer 71*a* and a wiring layer 71*b* disposed on the base layer 71*a*. The reflective banks 72 are disposed on the circuit substrate 71. Each of the reflective banks 72 has at least one side wall 72s substantially perpendicular to a surface 71s of the circuit substrate 71. The reflective banks 72 together with the surface 71s of the circuit substrate 71 define a plurality of accommodating spaces (such as, the accommodating spaces 76a, 76b and 76c).

The first light-emitting unit 73, the second light-emitting unit 74 and the third light-emitting unit 75 have the same structure as the electroluminescent device 200 as described above, wherein the first light-emitting unit 73 is disposed in the first accommodating space 76a; the second light-emitting unit 74 is disposed in the second accommodating space 76b; and the third light-emitting unit 75 is disposed in the third accommodating space 76c. The first light-emitting unit 73, the second light-emitting unit 74, and the third light-emitting unit 75 are respectively electrically connected to the wiring layer 71b disposed on the base layer 71a of the circuit substrate 71.

The light emitted from the active layers 103 in the first light-emitting unit 73 and the second light-emitting unit 74 is blue light. The optical conversion material filled in the cavity 208 of the first light-emitting unit 73 is a red optical conversion material 77R that can convert blue light into red light; the optical conversion material filled in the cavities 208 of the second light-emitting unit 74 is a green optical conversion material 77G that can convert the blue light into green light; the third light-emitting unit 705 is an LED device that can emit blue light.

The accommodating spaces 76a, 76b and 76c are filled with a light-transmitting material 78 and cover the first light-emitting unit 73, the second light-emitting unit 74 and the third light-emitting unit 75. The display apparatus 70 also includes a transparent passivation protective layer 79 disposed on the light-transmitting material 78. The red light, green light and blue light emitted from the first light emitting unit 73, the second light emitting unit 74 and the third light emitting unit 75 respectively exit from the openings 76o of the accommodating spaces 76a, 76b and 76c. The first light-emitting unit 73, the second light-emitting unit 74 and the third light-emitting unit 75 may constitute one pixel unit of the display apparatus 70.

Figure 8:
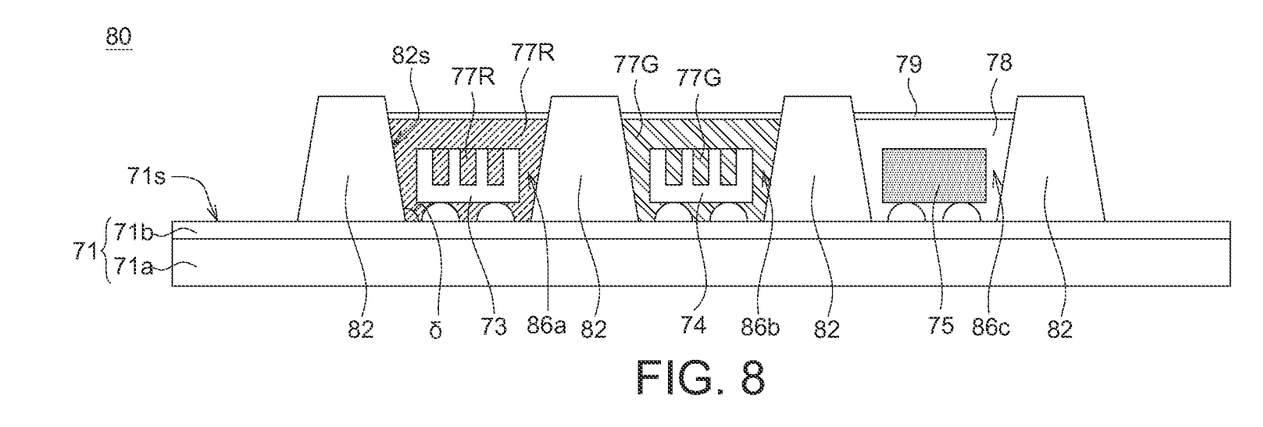
FIG. 8 is a cross-sectional view illustrating the structure of a display apparatus according to another embodiment of the present disclosure.

FIG. 8 is a cross-sectional view illustrating the structure of a display apparatus 80 according to another embodiment of the present disclosure. The structure of the display apparatus 80 is substantially similar to that of the display apparatus 70, and the main difference lines on the shape of the reflective blanks 82 and the materials filled in the accommodating spaces 86a, 86b and 86c.

In the present embodiment, each of the reflective blanks 82 of the display apparatus 80 has at least one side wall 82s to form an included angle δ, substantially ranging from 45° to 60°, with the sur face 71s of the circuit substrate 71. The accommodating space 86a is filled with the red optical conversion material 77R, and the red optical conversion material 77R covers the first light-emitting unit 73. The accommodating space 86b is filled with the green optical conversion material 77G, and the green optical conversion material 77G covers the second light-emitting unit 74. The accommodating space 86c It is filled with the light-transmitting material 78, and the light-transmitting material 78 covers the third light-emitting unit 75.

Figure 9:
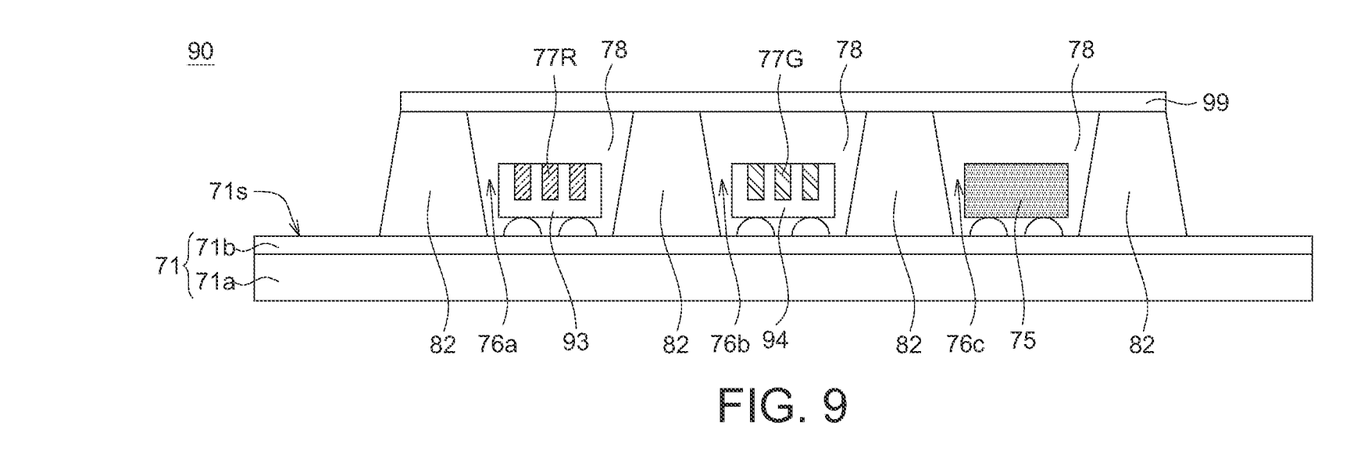
FIG. 9 is a cross-sectional view illustrating the structure of a display apparatus according to yet another embodiment of the present disclosure.

FIG. 9 is a cross-sectional view illustrating the structure of a display apparatus 90 according to yet another embodiment of the present disclosure. The structure of the display apparatus 90 is substantially similar to that of the display apparatus 80, and the main difference is that the light emitted from the active layers 103 in the first light-emitting unit 93 and the second light-emitting unit 94 is a ultraviolet (UV) light. The accommodating spaces 76a, 76b and 76c are filled with the light-transmitting material 78, and the light-transmitting material 78 covers the first light-emitting unit 93, the second light-emitting unit 94 and the third light-emitting unit 75. The light-transmitting material 78 further includes a UV filter (VU cut) layer 99 for filtering the portion of the light (ultraviolet light) that is not converted into red light and green light by the red optical conversion material 77R and the green optical conversion material 77G.

According to the above embodiments, the present disclosure provides an electroluminescent device and a display apparatus applying the same. A plurality of regularly arranged 3D structures are formed on a light-emitting surface of a semiconductor layer, extending from the light-emitting surface towards the active layer to jointly define at least one cavity, so that the depth of the cavity cab be substantially greater than 70% the thickness of the semiconductor layer, and allowing an optical conversion material filled in the cavity.

By filling the optical conversion material in the cavity of the semiconductor layer, the reaction probability of the light emitted by the active layer of the electroluminescent device and the optical conversion material can be increased without increasing the overall thickness of the optical conversion material encapsulating the electroluminescent device or increasing the concentration of quantum dots contained in the optical conversion material. Thereby, the light absorption/conversion efficiency of the electroluminescent device can be improved; the manufacturing cost can be effectively reduced, and the miniaturization of the electroluminescent device and the thinning of the display apparatus applying the electroluminescent device can achieved at the same time.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electroluminescent device, comprising:
   a first-conductivity-type semiconductor layer;
   a second-conductivity-type semiconductor layer;
   an active layer, disposed between the first-conductivity-type semiconductor layer and the second-conductivity-type semiconductor layer and electrically connected with these two,
   wherein the first-conductivity-type semiconductor layer has a light-emitting surface disposed on a side opposite to the active layer; and comprises a plurality of three-dimensional (3D) structures arranged regularly, extending from the light-emitting surface towards the active layer to jointly define at least one cavity having a depth greater than 70% a thickness of the first-conductivity-type semiconductor layer;
   a first electrode, electrically contacting to the first-conductivity-type semiconductor layer;
   a second electrode electrically contacting to the second-conductivity-type semiconductor layer, and
   an optical conversion material, filled in the at least one cavity.

2. The electroluminescent device according to claim 1, wherein the first-conductivity-type semiconductor layer comprises an n-type GaN layer; the second-conductivitytype semiconductor layer comprises a p-type GaN layer; and the active layer comprises a (Multiple-Quantum Well, MQW) structure.

3. The electroluminescent device according to claim 1, wherein the plurality of 3D structures comprises a plurality of protruding pillars or a plurality of recesses with substantially the same size and shape and regularly arranged; and the at least one cavity is disposed between the plurality of protruding pillars or is one of the plurality of recesses.

4. The electroluminescent device according to claim 3, wherein there is a pitch between two adjacent ones of the plurality of protruding pillars or the plurality of recesses; and the pitch is substantially 1.5 to 5 times of a diameter of the plurality of protruding pillars or the plurality of recesses.

5. The electroluminescent device according to claim 3, wherein the plurality of protruding pillars or the plurality of recesses are arranged in a honeycomb pattern.

6. The electroluminescent device according to claim 1, wherein the at least one cavity has a longitudinal section perpendicular to a stacking direction of the active layer, the first-electricity-type semiconductor layer and the second-electricity-type semiconductor layer; and the longitudinal section is a wedge-shaped longitudinal section, a strip-shaped longitudinal section or an arc-shaped longitudinal section.

7. The electroluminescent device according to claim 1, wherein the at least one cavity has a bottom surface departed from the active layer for a distance substantially less than 1 micrometers ($\mu m$), and has a depth about 2 $\mu m$ to 3 $\mu m$.

8. The electroluminescent device according to claim 1, wherein the at least one cavity passes through the first-electricity-type semiconductor layer and the active layer, and partially extends into the second-electricity-type semiconductor layer.

9. The electroluminescent device according to claim 1, further comprising a metal reflecting layer disposed on the light-emitting surface and having at least one through hole aligned with the at least one cavity.

10. A display apparatus, comprising:
a circuit substrate,
at least one reflection bank, disposed on the circuit substrate, and together with the circuit substrate defining a plurality of accommodating spaces;
a first light-emitting unit, having an identical structure the same to that of a electroluminescent device, disposed in a first one of a plurality of accommodating spaces, and emitting a red light, wherein the electroluminescent device comprises;
a first-conductivity-type semiconductor layer;
a second-conductivity-type semiconductor layer;
an active layer, disposed between the first-conductivity-type semiconductor layer and the second-conductivity-type semiconductor layer and electrically connected with these two,
wherein the first-conductivity-type semiconductor layer has a light-emitting surface disposed on a side opposite to the active layer; and comprises a plurality of 3D structures arranged regularly, extending from the light-emitting surface towards the active layer to jointly define at least one cavity having a depth greater than 70% a thickness of the first-conductivity-type semiconductor layer;
a first electrode, electrically contacting to the first-conductivity-type semiconductor layer;
a second electrode electrically contacting to the second-conductivity-type semiconductor layer, and
an optical conversion material, filled in the at least one cavity;
a second light-emitting unit, having the identical structure, disposed in a second one of the plurality of accommodating spaces, and emitting a green light; and
a third light-emitting unit, disposed in a third one of the plurality of accommodating spaces, and emitting a blue light.

11. The display apparatus according to claim 10, wherein the first one, the second one and the third one of the plurality of accommodating spaces are filled with a light-transmitting material; a side wall of the at least one reflection bank and a surface of the circuit substrate that are used together to define the plurality of accommodating spaces, are perpendicular to each other.

12. The display apparatus according to claim 10, wherein a side wall of the at least one reflection bank and a surface of the circuit substrate that are used together to define the plurality of accommodating spaces, form an included angle substantially ranging from 45° to 60°.

13. The display apparatus according to claim 12, wherein the first one of the plurality of accommodating spaces filled with a red optical conversion material;
the second one of the plurality of accommodating spaces filled with a green optical conversion material; and
the third one of the plurality of accommodating spaces filled with a light-transmitting material.

14. The display apparatus according to claim 10, wherein a first active layer of the first light-emitting unit and a second active layer of the second light-emitting unit respective emit a ultraviolet light.

15. The display apparatus according to claim 10, further comprising a UV filter (VU cut) layer.

* * * * *